United States Patent
Tieger et al.

(10) Patent No.: US 10,290,461 B1
(45) Date of Patent: May 14, 2019

(54) ION SOURCE FOR ENHANCED IONIZATION

(71) Applicant: Varian Semiconductor Equipment Associates, Inc., Gloucester, MA (US)

(72) Inventors: Daniel R. Tieger, Manchester, MA (US); Klaus Becker, Kensington, NH (US); Daniel Alvarado, Methuen, MA (US); Alexander S. Perel, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/566,311

(22) PCT Filed: May 23, 2017

(86) PCT No.: PCT/US2017/033981
§ 371 (c)(1),
(2) Date: Oct. 13, 2017

(87) PCT Pub. No.: WO2018/004878
PCT Pub. Date: Jan. 4, 2018

Related U.S. Application Data

(63) Continuation of application No. 15/198,723, filed on Jun. 30, 2016, now Pat. No. 9,691,584.

(51) Int. Cl.
*H01J 27/26* (2006.01)
*H01J 37/08* (2006.01)
*H01J 27/20* (2006.01)
*H01J 37/32* (2006.01)

(52) U.S. Cl.
CPC ............ *H01J 37/08* (2013.01); *H01J 27/205* (2013.01); *H01J 37/3233* (2013.01); *H01J 37/3255* (2013.01); *H01J 37/3266* (2013.01); *H01J 37/32449* (2013.01)

(58) Field of Classification Search
None
See application file for complete search history.

(56) References Cited

U.S. PATENT DOCUMENTS

| 7,102,139 B2 | 9/2006 | Low et al. |
| 9,691,584 B1 | 6/2017 | Tieger et al. |

OTHER PUBLICATIONS

Daniel Alvarado, et al., Ion Source for Multiple Charged Species, Non-provisional U.S. Appl. No. 14/972,412, filed Dec. 17, 2015.

*Primary Examiner* — Vip Patel
(74) *Attorney, Agent, or Firm* — Nields, Lemack & Frame, LLC

(57) ABSTRACT

An ion source having improved life is disclosed. In certain embodiments, the ion source is an IHC ion source comprising a chamber, having a plurality of electrically conductive walls, having a cathode which is electrically connected to the walls of the ion source. Electrodes are disposed on one or more walls of the ion source. A bias voltage is applied to at least one of the electrodes, relative to the walls of the chamber. In certain embodiments, fewer positive ions are attracted to the cathode, reducing the amount of sputtering experienced by the cathode. Advantageously, the life of the cathode is improved using this technique. In another embodiment, the ion source comprises a Bernas ion source comprising a chamber having a filament with one lead of the filament connected to the walls of the ion source.

21 Claims, 4 Drawing Sheets

ION SOURCE FOR ENHANCED IONIZATION

FIELD

Embodiments of the present disclosure relate to an ion source, and more particularly, an ion source with the cathode electrically connected to the walls of the chamber to improve the life of the ion source.

BACKGROUND

Various types of ion sources may be used to create the ions that are used in semiconductor processing equipment. For example, Bernas ion sources operate by passing current through a filament disposed in a chamber. The filament emits electrons which excite the gas that is introduced to the chamber. A magnetic field may be used to confine the path of the electrons. In certain embodiments, electrodes are also disposed on one or more walls of the chamber. These electrodes may be positively or negatively biased so as to control the position of ions and electrons, so as to increase the ion density near the center of the chamber. An extraction aperture is disposed along another side, proximate the center of the chamber, through which the ions may be extracted.

One issue associated with Bernas ion source is the life of the filament. Since the filament is exposed in the chamber, it is subject to sputtering and other phenomenon which reduce its life. In some embodiments, the life of the Bernas ion source is dictated by the life of the filament.

A second type of ion source is the indirectly heated cathode (IHC) ion source. IHC ion sources operate by supplying a current to a filament disposed behind a cathode. The filament emits thermionic electrons, which are accelerated toward and heat the cathode, in turn causing the cathode to emit electrons into the chamber of the ion source. Since the filament is protected by the cathode, its life may be extended relative to the Bernas ion source. The cathode is disposed at one end of a chamber. A repeller is typically disposed on the end of the chamber opposite the cathode. The cathode and repeller may be biased so as to repel the electrons, directing them back toward the center of the chamber. In some embodiments, a magnetic field is used to further confine the electrons within the chamber.

In certain embodiments, electrodes are also disposed on one or more side walls of the chamber. These electrodes may be positively or negatively biased so as to control the position of ions and electrons, so as to increase the ion density near the center of the chamber. An extraction aperture is disposed along another side, proximate the center of the chamber, through which the ions may be extracted.

One issue associated with IHC ion sources is that the cathode may have a limited lifetime. The cathode is subjected to bombardment from electrons on its back surface, and by positively charged ions on its front surface. The ion bombardment results in sputtering, which causes erosion of the cathode. In many embodiments, the life of the IHC ion source is dictated by the life of the cathode. In certain embodiments, chemical vapor deposition from the plasma may cause the negatively charged cathode to become electrically connected to the grounded walls of the ion source, causing failure of the ion source.

Therefore, an ion source that has increased life may be beneficial. Further, it would be advantageous if the ion source experienced less sputtering on the components used for electron generation.

SUMMARY

An ion source having improved life is disclosed. In certain embodiments, the ion source is an IHC ion source comprising a chamber, having a plurality of electrically conductive walls, having a cathode which is electrically connected to the walls of the ion source. Electrodes are disposed on one or more walls of the ion source. A bias voltage is applied to at least one of the electrodes, relative to the walls of the chamber. In certain embodiments, fewer positive ions are attracted to the cathode, reducing the amount of sputtering experienced by the cathode. Advantageously, the life of the cathode is improved using this technique. In another embodiment, the ion source comprises a Bernas ion source comprising a chamber having a filament with one side of the filament connected to the walls of the ion source.

According to one embodiment, an indirectly heated cathode ion source is disclosed. The indirectly heated cathode ion source comprises a chamber, comprising a plurality of electrically conductive walls, into which a gas is introduced; a cathode disposed on one end of the chamber; a filament disposed behind the cathode; a magnetic field passing through the chamber; a top wall having an extraction aperture; and an electrode disposed in the chamber along a wall of the chamber; wherein a voltage is applied to the electrode relative to the chamber and the cathode is electrically connected to the chamber. In some embodiments, the electrode is disposed on a side wall parallel to the magnetic field. In a further embodiment, a second electrode is disposed on a side wall opposite the electrode, wherein an electric field between the electrode and the second electrode and the magnetic field are perpendicular to each other. In certain embodiments, the electrode is disposed on the top wall on opposite sides of the extraction aperture.

In a second embodiment, an indirectly heated cathode ion source is disclosed. The indirectly heated cathode ion source comprises a chamber, comprising a plurality of electrically conductive walls, into which a gas is introduced; a cathode disposed on one wall of the chamber; a filament disposed behind the cathode; a magnetic field passing through the chamber; and an electrode disposed in the chamber on a wall opposite the cathode; wherein the cathode is disposed on a wall parallel to the magnetic field. In certain embodiments, the cathode is electrically connected to the chamber. In certain embodiments, the electrode is positively biased relative to the chamber.

In a third embodiments, a Bernas ion source is disclosed. The Bernas ion source comprises a chamber, comprising a plurality of electrically conductive walls, into which a gas is introduced; a filament disposed on one end of the chamber; a magnetic field passing through the chamber; a top wall having an extraction aperture; and an electrode disposed along a wall of the chamber; wherein a voltage is applied to the electrode relative to the chamber and one lead of the filament is electrically connected to the chamber. In certain embodiments, the electrode is disposed on a side wall parallel to the magnetic field. In certain embodiments, a second electrode is disposed on a side wall opposite the electrode, wherein an electric field between the electrode and the second electrode and the magnetic field are perpendicular to each other.

BRIEF DESCRIPTION OF THE FIGURES

For a better understanding of the present disclosure, reference is made to the accompanying drawings, which are incorporated herein by reference and in which.

DETAILED DESCRIPTION

As described above, ion sources may be susceptible to shortened life due to the effect of sputtering, especially on the components that are used to generate electrons. Typically, over time, these components fail. In certain embodiments, the failure of an IHC ion source is caused by an electrical short circuit between the cathode and the walls of the ion source, or by an electrical short circuit between the repeller and the walls of the ion source. Similarly, Bernas ion sources may be susceptible to shortened life due to the effect of sputtering on the filament.

Figure 1:
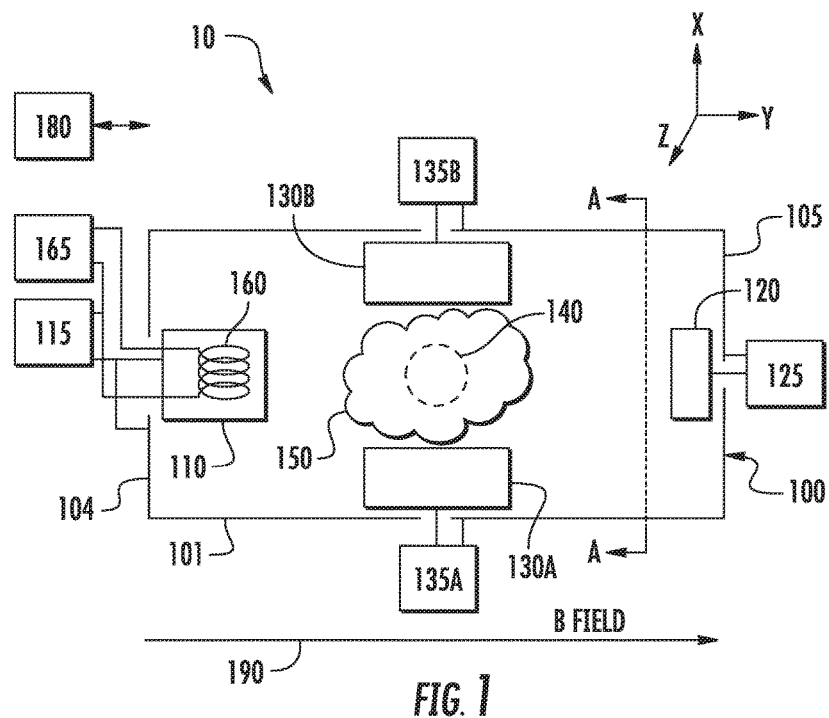
FIG. 1 is an indirectly heated cathode (IHC) ion source in accordance with one embodiment.
Figure 4:
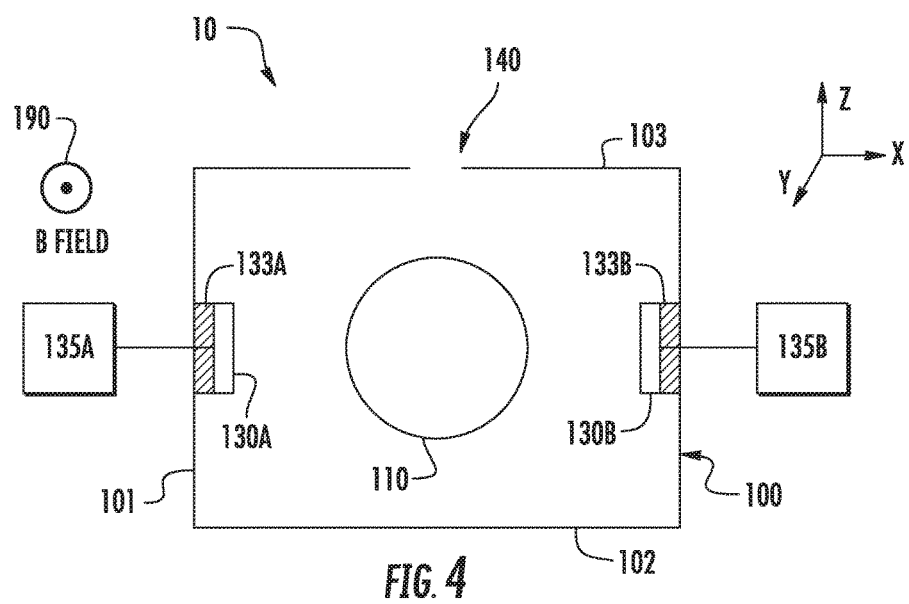
FIG. 4 is a cross-sectional view of the IHC ion source of FIG. 1.

FIG. 1 shows an IHC ion source 10 that overcomes these issues. FIG. 4 is a cross-sectional view of the IHC ion source 10. The IHC ion source 10 includes a chamber 100, comprising two opposite ends, and side walls 101 connecting to these ends. The chamber 100 also includes a bottom wall 102 and a top wall 103. The walls of the chamber may be constructed of an electrically conductive material and may be in electrical communication with one another. A cathode 110 is disposed in the chamber 100 at a first end 104 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. Additionally, the cathode 110 is electrical connected to the chamber 100, so as to be at the same voltage as the walls of the chamber 100. In certain embodiments, the chamber 100 is connected to electrical ground.

In this embodiment, a repeller 120 is disposed in the chamber 100 on the second end 105 of the chamber 100 opposite the cathode 110. The repeller 120 may be in communication with repeller power supply 125. As the name suggests, the repeller 120 serves to repel the electrons emitted from the cathode 110 back toward the center of the chamber 100. For example, the repeller 120 may be biased at a negative voltage relative to the chamber 100 to repel the electrons. For example, the repeller power supply 125 may have an output in the range of 0 to −150V, although other voltages may be used. In certain embodiments, the repeller 120 is biased at between 0 and −150V relative to the chamber 100. In certain embodiments, the repeller 120 may be floated relative to the chamber 100. In other words, when floated, the repeller 120 is not electrically connected to the repeller power supply 125 or to the chamber 100. In this embodiment, the voltage of the repeller 120 tends to drift to a voltage close to that of the cathode 110.

In certain embodiments, a magnetic field 190 is generated in the chamber 100. This magnetic field is intended to confine the electrons along one direction. The magnetic field 190 typically runs parallel to the side walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

In the embodiment shown in FIG. 1, electrodes 130a, 130b may be disposed on side walls 101 of the chamber 100, such that the electrodes 130a, 130b are within the chamber 100. The electrodes 130a, 130b may be biased by a power supply. In certain embodiments, the electrodes 130a, 130b may be in communication with a common power supply. However, in other embodiments, to allow maximum flexibility and ability to tune the output of the IHC ion source 10, the electrodes 130a, 130b may each be in communication with a respective electrode power supply 135a, 135b.

Like repeller power supply 125, the electrode power supplies 135a, 135b serve to bias the electrodes 130a, 130b relative to the chamber 100. In certain embodiments, the electrode power supplies 135a, 135b may bias the electrodes 130a, 130b positively or negatively relative the chamber 100. In certain embodiments, at least one of the electrodes 130a, 130b may be biased at between 40 and 500 volts relative to the chamber 100.

Each of the cathode 110, the repeller 120 and the electrodes 130a, 130b are made of an electrically conductive material, such as a metal.

Disposed on another side of the chamber 100, referred to as the top wall 103, may be an extraction aperture 140. In FIG. 1, the extraction aperture 140 is disposed on a side that is parallel to the X-Y plane (parallel to the page). Further, while not shown, the IHC ion source 10 also comprises a gas inlet through which the gas to be ionized is introduced to the chamber 100.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

The controller 180 may be used to select an initial voltage or current to be supplied by cathode bias power supply 115, filament power supply 165, electrode power supplies 135a, 135b, and repeller power supply 125. This initial voltage may be based on the type of gas being used, or on the type of ions that are to be extracted from the IHC ion source 10. Further, in certain embodiments, the controller may also monitor the current of the extracted ion beam. Based on the monitored extraction current, the controller 180 may vary at least the current supplied by filament power supply 165 to achieve a desired extraction current.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the chamber 100. These electrons collide with the molecules of gas that are fed into the chamber 100 through the gas inlet. These collisions create positive ions, which form a plasma 150. The plasma 150 may be confined and manipulated by the electrical fields created by the repeller 120, and the electrodes 130a, 130b. Further, in certain embodiments, the electrons and positive ions may be somewhat confined by the magnetic field 190. In certain embodiments, the plasma 150 is confined near the center of the chamber 100, proximate the extraction aperture 140.

Since the cathode 110 is not biased relative to the chamber 100, fewer positive ions are attracted to the cathode 110 and these ions have lower energy so they sputter less. Thus, the amount of sputtering may be reduced and the life of the cathode 110 may be extended. Further, even in the presence of sputtering, the risk of electrical short circuit is eliminated as the cathode 110 is at the same voltage as the walls of the chamber 100.

In this embodiment, the electrons are attracted to the electrode 130a, which may be positively biased relative to the chamber 100. However, the electrons need to overcome electromagnetic forces to cross the magnetic field 190. Thus, the selection of the strength of the magnetic field 190 and the positive voltage applied by electrode power supply 135a determines the velocity and energy of the electrons as the electrons are attracted toward electrode 130a. A greater magnetic field with a low positive bias voltage applied to the electrode 130a will reduce the amount of electrons that are able to cross the magnetic field 190. In contrast, a weak magnetic field coupled with a greater bias voltage applied to the electrode 130a will cause more electrons, moving at a higher velocity, to move toward the electrode 130a.

Thus, by varying the strength of the magnetic field 190 and the voltage applied by the electrode power supply 135a, the velocity and energy of the electrons may be manipulated. This allows the IHC ion source 10 to be useful for multiple charged ions, monomers, and ionized molecules.

For example, for single charged ions, a rich gas may be used in conjunction with a weak magnetic field. In certain embodiment, a first voltage may be applied by the electrode power supply 135a. For multiple charged ions, a lean gas may be used in conjunction with a strong magnetic field. In this embodiment, the voltage applied to the electrode 130a may be greater than the first voltage. Stronger magnetic fields may cause more collisions to occur, creating multiple charged species.

Figure 2:
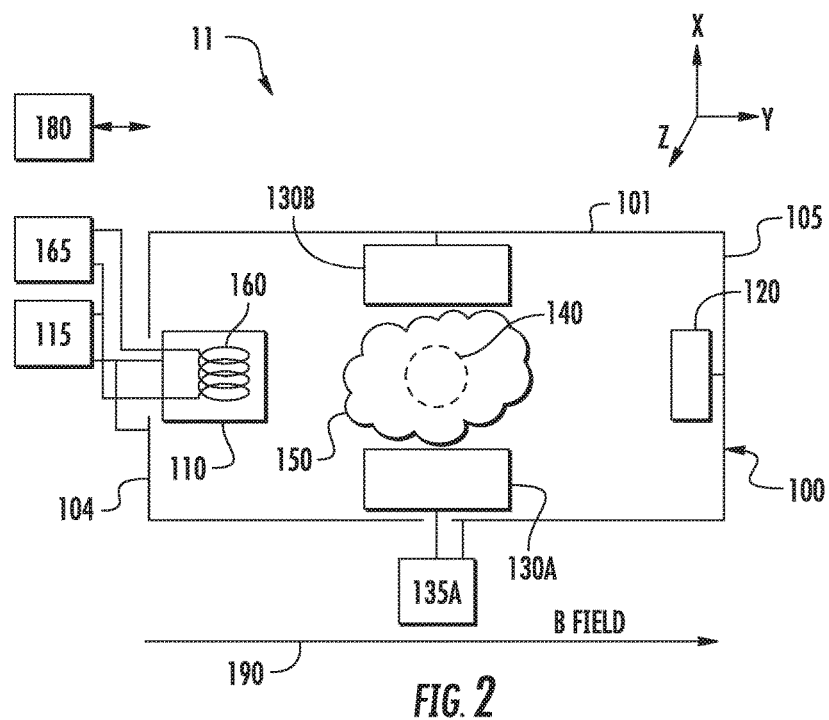
FIG. 2 is an IHC ion source in accordance with another embodiment.

FIG. 1 shows an embodiment of an IHC ion source 10 where the cathode 110 is electrically connected to the chamber 100, while the repeller 120, and the electrodes 130a, 130b are all individually biased relative to the chamber 100 using repeller power supply 125, and electrode power supplies 135a, 135b, respectively. FIG. 2 shows an IHC ion source 11 according to another embodiment. Similar components have been given identical reference designators. The IHC ion source 11 has the cathode 110 and the repeller 120 both electrically connected to the chamber 100. Further, one of the electrodes 130b is also electrically connected to the chamber 100. In other words, the cathode 110, the repeller 120, the electrode 130b and the walls of the chamber 100 are all at the same voltage. Therefore, electrode power supply 135b and repeller power supply 125 may be eliminated.

In this embodiment, only electrode 130a is biased relative to the chamber 100. The electrode 130a may be positively biased at between 40 and 500 volts relative to the chamber 100. Thus, the electric field within the chamber 100 is created solely by electrode 130a. Further, the electrical field between the electrodes 130a, 130b is perpendicular to the magnetic field 190. Specifically, the magnetic field 190 is in the Y direction, while the electrical field between the electrodes 130a, 130b is in the X direction. Therefore, the electromagnetic force is primarily in the Z direction. In some embodiments, the electromagnetic force is upward toward the extraction aperture 140.

Figure 3:
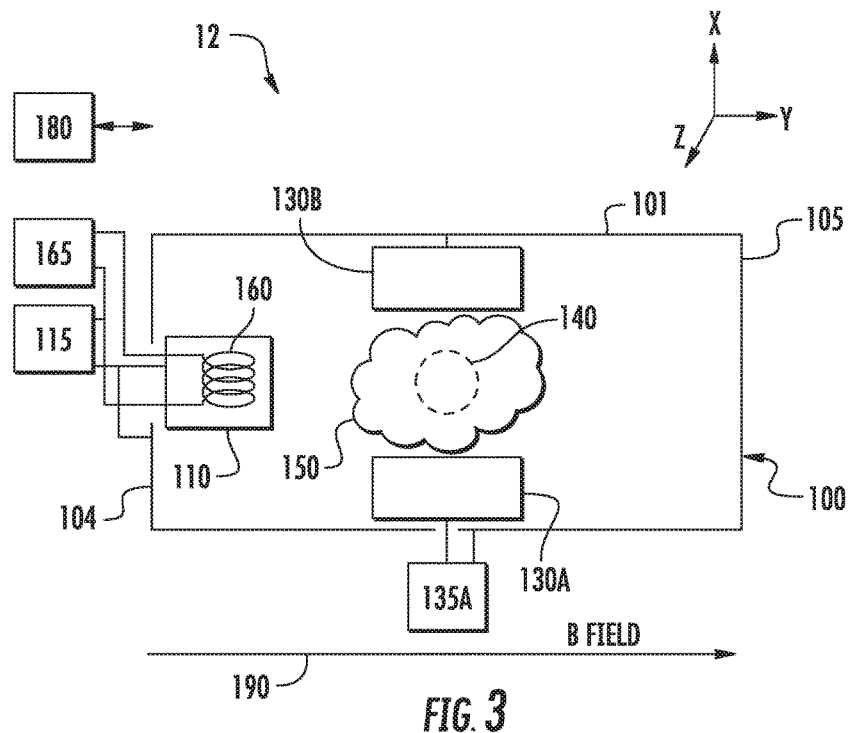
FIG. 3 is an IHC ion source in accordance with another embodiment.

FIG. 3 shows a variation of the IHC ion source 11 illustrated in FIG. 2. In FIG. 3, the repeller of the IHC ion source 12 has been eliminated. Since the repeller 120 shown in FIG. 2 is at the same voltage as the chamber 100, its removal in FIG. 3 does not alter the operation of the IHC ion source 12. In other words, the second end 105 opposite the cathode 110 is biased at the same voltage as the walls of the chamber 100 in both embodiments.

FIG. 4 shows a cross-sectional view of the IHC ion source 10 of FIG. 1, taken along line AA of FIG. 1. In this figure, the cathode 110 is shown against the first end 104 of the IHC ion source 10. Electrodes 130a and 130b are shown on opposite side walls 101 of the chamber 100. The magnetic field 190 is shown directed out of the page, in the Y direction. In certain embodiments, the electrodes 130a, 130b may be separated from the side walls 101 of the chamber 100 through the use of insulators 133a, 133b, respectively. Electrical connections from the electrode power supplies 135a, 135b may be made to the electrodes 130a, 130b by passing a conductive material from the exterior of the chamber 100 through the insulators 133a, 133b and to the respective electrodes 130a, 130b. In certain embodiments, electrode 130b may be in electrical communication with the chamber 100. In these embodiments, the insulator 133b may not be employed and the electrode 130b may be disposed against the side wall 101. Further, in certain embodiments, since the electrode 130b is at the same voltage as the side wall 101, it may be eliminated.

Further, in certain embodiments, insulators 133a, 133b are not employed. Rather, if the electrode 130a is biased relatively to the chamber 100, the electrode 130a may be spaced apart from the wall of the chamber 100.

Figure 5:
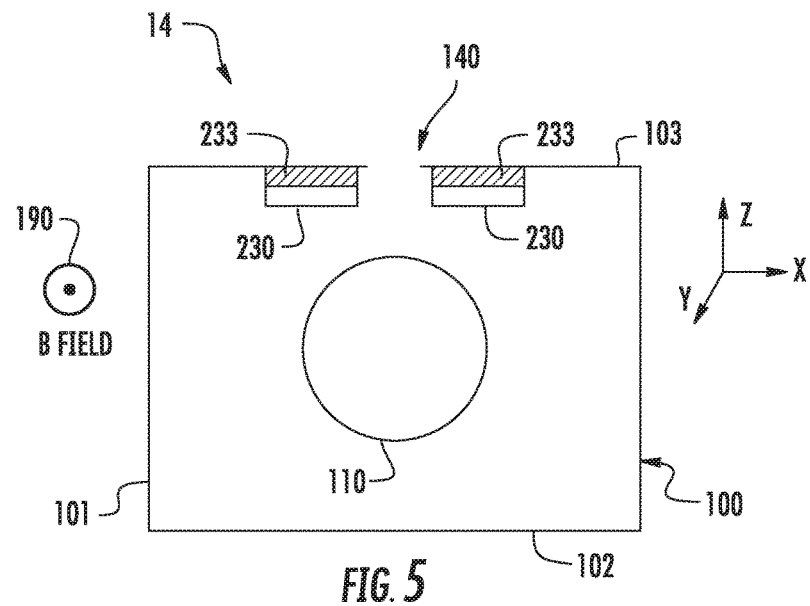
FIG. 5 is a cross-sectional view of an IHC ion source according to another embodiment.

While FIGS. 1-4 all show the electrodes 130a, 130b disposed along opposite side walls 101 of the chamber 100, other embodiments are also possible. FIG. 5 shows such an embodiment. FIG. 5 is a cross-sectional view of an IHC ion source 14. This IHC ion source 14 is similar to the other IHC ion sources in most respects, except for the location of the electrode 230. In this embodiment, the electrode 230 is disposed on the top wall 103 of the chamber 100, where the extraction aperture 140 is disposed. The electrode 230 may be isolated from the top wall 103 using insulator 233. In some embodiments, the electrode 230 may be disposed within the chamber 100 and surround the entirety of the extraction aperture 140. In other embodiments, the electrode 230 may be disposed within the chamber 100 on opposite sides of the extraction aperture 140. Thus, the electrical field is strongest proximate the extraction aperture 140. This configuration may increase the ion beam current or energy relative to the configuration of FIG. 4.

Figure 6:
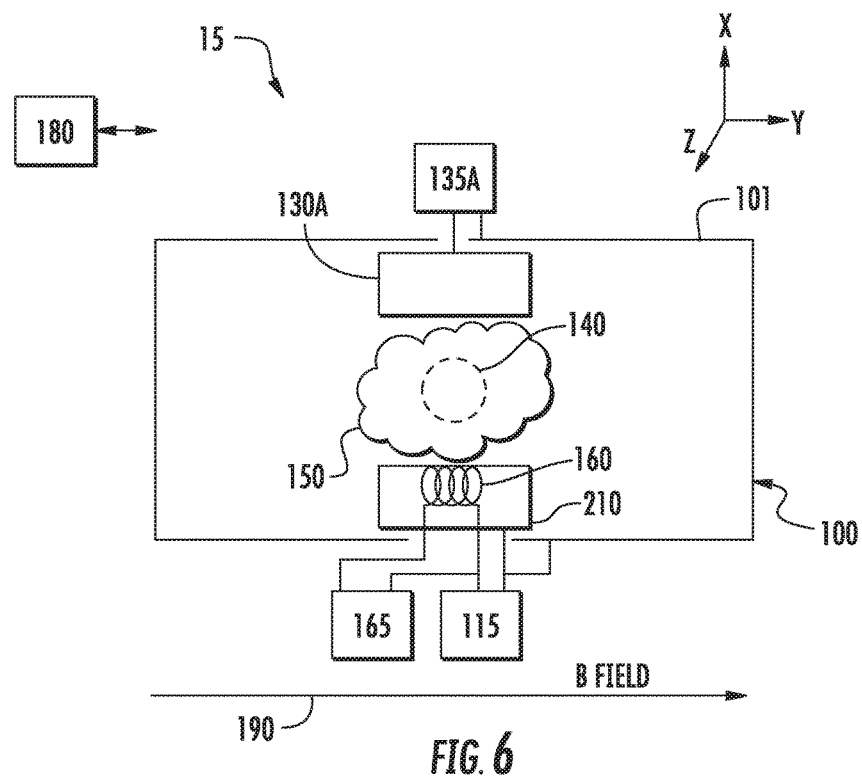
FIG. 6 is an IHC ion source in accordance with another embodiment.

FIG. 6 shows another embodiment of an IHC ion source 15. In this embodiment, the cathode 210 and the filament 160 have been moved from the end of the IHC ion source 15 to a side wall 101, opposite electrode 130a. In other words, the cathode 210 is disposed on a side wall 101 that is parallel to the magnetic field 190. Thus, unlike the earlier embodiments, the electrons emitted from the cathode 210 encounter magnetic field 190 immediately. Thus, the voltage applied by electrode power supply 135a to electrode 130a may be sufficiently large to attract the emitted electrons across the magnetic field 190. Alternatively or additionally, the magnetic field 190 may be relatively weak to allow the electrons to cross the field toward the electrode 130a. In this embodiment, the two ends of the IHC ion source 15, which typically contain the cathode and repeller, may not be populated.

The embodiments described above in the present application may have many advantages. First, since the cathode is electrically connected to the chamber, short circuits between the cathode and the wall of the chamber are not problematic, eliminating a common cause of IHC ion source failure. Second, since the cathode is electrically connected to the chamber, fewer positive ions are attracted to the cathode, reducing the amount of sputtering that the cathode is exposed to. Third, the source power is reduced relative to conventional IHC ion sources for equivalent extraction current, contributing to longer ion source life as well. Further, ion sources according to the embodiments described herein work equally well for multi-charged, monomer and molecular species. Empirical data has shown that the ion sources described herein provide up to 40% more beam current at up to 30% less source power.

Figure 7:
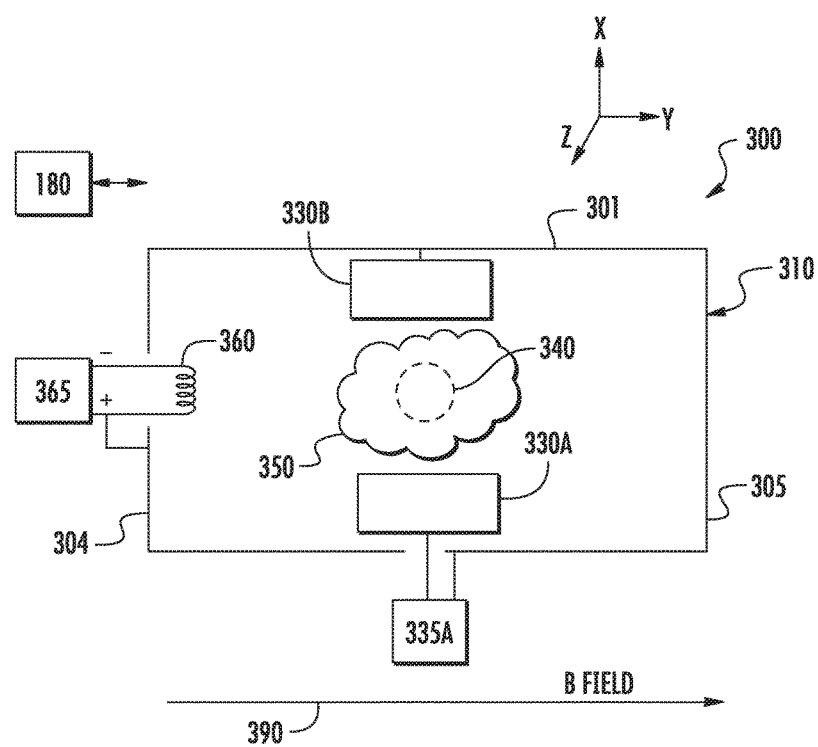
FIG. 7 is an ion source in accordance with another embodiment.

The concept of maintaining the components used for electron generation at or near the voltage of the chamber can be applied to other ion sources as well. FIG. 7 shows a Bernas ion source 300 according to one embodiment.

Like the IHC ion source shown in FIG. 3, the Bernas ion source 300 includes a chamber 310 having a plurality of electrically conductive walls. The Bernas ion source 300 may or may not have a repeller. Additionally, electrodes 330a, 330b may be disposed on opposite side walls 301. The Bernas ion source 300 includes a filament 360, which is in communication with a filament power supply 365. The positive terminal of the filament power supply 365 is in communication with one lead of the filament 360 and is also in communication with the walls of the chamber 310. The negative terminal of the filament power supply 365 is in communication with the other lead of the filament 360. The voltage across the leads of the filament 360 may be less than 10 volts. The filament 360 may be disposed at the first end 304 of the chamber 310.

A magnetic field 390 may also be applied from the first end 304 of the Bernas ion source 300 toward the second end 305, which is opposite the first end 304. Like with the IHC ion sources described above, electrons may be somewhat confined to columns that are oriented in the Y direction. The electrode 330a may be positively biased relative the chamber 310, and may be disposed on a side wall 301.

During operation, the filament power supply 365 passes a current through the filament 360, which causes the filament 360 to emit thermionic electrons. These electrons collide with the molecules of gas that are fed into the chamber 310 through the gas inlet. These collisions create positive ions, which form a plasma 350. The plasma 350 may be confined and manipulated by the electrical fields created by the electrodes 330a, 330b. Like the IHC ion sources, the electrode 330a may be in communication with an electrode power supply 335a. Further, in certain embodiments, the electrons and positive ions may be somewhat confined by the magnetic field 390. In certain embodiments, the plasma 350 is confined near the center of the chamber 310, proximate the extraction aperture 340.

The function of controller 180 may be as described above.

Since one lead of the filament 360 is electrically connected to the chamber 310, fewer positive ions are attracted to the filament 360. Thus, the amount of sputtering may be reduced and the life of the filament 360 may be extended.

While FIG. 7 shows a Bernas ion source 300 with the electrode 330b electrically connected to the chamber 310 and without a repeller, other embodiments are also possible. For example, the cathode 110, cathode bias power supply 115, filament 160 and filament power supply 165 of FIGS. 1 and 2 may be replaced with the filament 360 and filament power supply 365 shown in FIG. 7. In other words, in certain embodiments, the Bernas ion source may include a repeller, which may be grounded to the chamber, or a repeller in communication with a repeller power supply. Additionally, in certain embodiments, the electrode 330b may be in communication with an electrode power supply.

Additionally, the Bernas ion source 300 of FIG. 7 may be modified by disposing the electrode 330a on the top wall, as shown in FIG. 5.

Like the IHC ion sources described earlier, the embodiments of the Bernas ion source described above in the present application may have many advantages. For example, since one lead of the filament is electrically connected to the chamber, fewer positive ions are attracted to the filament, reducing the amount of sputtering that the filament is exposed to. This reduction in sputtering may extend the life of the filament.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode ion source, comprising:
   a chamber, comprising two opposite ends and two sidewalls connecting the two opposite ends;
   a cathode disposed on one of the two opposite ends of the chamber;
   a filament disposed behind the cathode;
   a magnetic field passing through the chamber parallel to the sidewalls; and
   an electrode disposed in the chamber and on a first of the two sidewalls of the chamber;
   wherein a voltage is applied to the electrode so that the electrode is electrically biased relative to the chamber and the cathode is electrically connected to the chamber.

2. The indirectly heated cathode ion source of claim 1, wherein a repeller is disposed on a second of the two opposite ends of the chamber.

3. The indirectly heated cathode ion source of claim 2, wherein the repeller is electrically connected to the chamber.

4. The indirectly heated cathode ion source of claim 1, wherein a repeller is not disposed within the chamber.

5. The indirectly heated cathode ion source of claim 1, wherein the electrode is positively biased relative to the chamber.

6. The indirectly heated cathode ion source of claim 1, wherein the two opposite ends extend in a height direction and a width direction, and the two sidewalls extend in the height direction and a length direction, and an electromagnetic force, which is created by the magnetic field and an electric field within the chamber, is in the height direction.

7. An indirectly heated cathode ion source, comprising:
- a chamber, comprising two opposite ends and two sidewalls connecting the two opposite ends;
- a cathode disposed on one of the two opposite ends of the chamber;
- a filament disposed behind the cathode;
- a first electrode disposed in the chamber and on a first of the two sidewalls of the chamber;
- a second electrode disposed in the chamber and on a second of the two sidewalls of the chamber;
- wherein a voltage is applied to the first electrode so that the first electrode is electrically biased relative to the chamber and the cathode is electrically connected to the chamber.

8. The indirectly heated cathode ion source of claim 7, wherein the second electrode is electrically biased relative to the chamber.

9. The indirectly heated cathode ion source of claim 8, wherein the first electrode and the second electrode are biased using a common power supply.

10. The indirectly heated cathode ion source of claim 8, wherein the first electrode and the second electrode are biased using two power supplies.

11. The indirectly heated cathode ion source of claim 7, wherein a repeller is disposed on a second of the two opposite ends of the chamber.

12. The indirectly heated cathode ion source of claim 11, wherein the repeller is electrically connected to the chamber.

13. The indirectly heated cathode ion source of claim 7, wherein a repeller is not disposed within the chamber.

14. An indirectly heated cathode ion source, comprising:
- a chamber, comprising two opposite ends, each end extending in a X direction and a Z direction, and two sidewalls connecting the two opposite ends, each sidewall extending in a Y direction and the Z direction;
- a cathode disposed on one of the two opposite ends of the chamber and electrically connected to the chamber;
- a filament disposed behind the cathode;
- a magnetic field passing through the chamber in the Y direction; and
- an electrode disposed in the chamber and on a first of the two sidewalls of the chamber;
- wherein a voltage is applied to the electrode so that the electrode is electrically biased relative to the chamber, and an electromagnetic force is created in the Z direction.

15. The indirectly heated cathode ion source of claim 14, wherein a repeller is disposed on a second of the two opposite ends of the chamber.

16. The indirectly heated cathode ion source of claim 15, wherein the repeller is electrically connected to the chamber.

17. The indirectly heated cathode ion source of claim 14, wherein a repeller is not disposed within the chamber.

18. The indirectly heated cathode ion source of claim 14, further comprising a second electrode disposed in the chamber and on a second of the two sidewalls of the chamber.

19. The indirectly heated cathode ion source of claim 18, wherein the second electrode is electrically biased relative to the chamber.

20. The indirectly heated cathode ion source of claim 19, wherein the first electrode and the second electrode are biased using a common power supply.

21. The indirectly heated cathode ion source of claim 19, wherein the first electrode and the second electrode are biased using two power supplies.

* * * * *